(12) United States Patent
Ono

(10) Patent No.: US 8,066,810 B2
(45) Date of Patent: Nov. 29, 2011

(54) LAMELLAR ZIRCONIUM PHOSPHATE

(75) Inventor: Yasuharu Ono, Nagoya (JP)

(73) Assignee: Toagosei Co., Ltd., Tokyo (JP)

( * ) Notice: Subject to any disclaimer, the term of this patent is extended or adjusted under 35 U.S.C. 154(b) by 401 days.

(21) Appl. No.: 12/312,126

(22) PCT Filed: Oct. 15, 2007

(86) PCT No.: PCT/JP2007/070075
§ 371 (c)(1),
(2), (4) Date: Apr. 27, 2009

(87) PCT Pub. No.: WO2008/053694
PCT Pub. Date: May 8, 2008

(65) Prior Publication Data
US 2009/0272293 A1    Nov. 5, 2009

(30) Foreign Application Priority Data

Oct. 27, 2006    (JP) .................................. 2006-293174

(51) Int. Cl.
*C09D 1/00*    (2006.01)
(52) U.S. Cl. .................. 106/286.2; 106/286.4; 423/309; 423/311
(58) Field of Classification Search ............... 106/286.2, 106/286.4; 423/309, 311
See application file for complete search history.

(56) References Cited

U.S. PATENT DOCUMENTS

| | | |
|---|---|---|
| 5,085,845 A | 2/1992 | Ueda et al. |
| 6,090,468 A | 7/2000 | Shimada et al. |

FOREIGN PATENT DOCUMENTS

| | | |
|---|---|---|
| JP | S59-102808 A | 6/1984 |
| JP | S60-103008 A | 6/1985 |
| JP | S61-270204 A | 11/1986 |
| JP | S62-226807 A | 10/1987 |
| JP | H10-13011 A | 1/1989 |
| JP | H01-319202 A | 12/1989 |
| JP | H03-150214 | 6/1991 |
| JP | H10-093245 A | 4/1998 |
| JP | H10-287830 A | 10/1998 |
| JP | H10-330696 A | 12/1998 |
| JP | H11-097589 A | 4/1999 |
| JP | 2001-267337 A | 9/2001 |
| JP | 2004-165681 A | 6/2004 |

OTHER PUBLICATIONS

Office Action dated Jan. 19, 2011, in corresponding Chinese Application No. 200780040144.8.

*Primary Examiner* — Anthony Green
*Assistant Examiner* — Pegah Parvini
(74) *Attorney, Agent, or Firm* — Fitch, Even, Tabin & Flannery

(57) ABSTRACT

The present invention provides a crystalline layered zirconium phosphate, which is an ion exchanger particle excellent in heat resistance and chemical resistance, and utilizable as an impurity ion trapping agent for electronic materials, a raw material for antibacterials, a deodorant, a discoloration inhibitor, a rust preventive and the like, and which is also excellent in various processabilities.

As a result of exhaustive studies to solve the problems, the present inventor has found a novel layered zirconium phosphate represented by the general formula (1) shown below:

$$Zr_{1-x}Hf_xH_a(PO_4)_b \cdot nH_2O \qquad (1)$$

wherein a and b are positive numbers satisfying $3b-a=4$; b is a number satisfying $2<b\leq2.3$; x is a positive number satisfying $0\leq x<1$; and n is a positive number satisfying $0\leq n\leq2$, and thus has achieved the present invention.

11 Claims, No Drawings

LAMELLAR ZIRCONIUM PHOSPHATE

CROSS-REFERENCE TO RELATED APPLICATIONS

This is a U.S. National Phase of International Application PCT/JP2007/070075, filed Oct. 15, 2007, and claims foreign priority under 35 U.S.C. §119 based on Japanese Application No. 2006-293174, filed Oct. 27, 2006, the entire disclosures of which applications are hereby incorporated herein by reference.

TECHNICAL FIELD

The present invention relates to a novel layered zirconium phosphate which is an ion exchanger excellent in heat resistance and chemical resistance and utilizable as a trapping agent for impurity ions in electronic materials, a raw material for antibacterials, a deodorant, a discoloration inhibitor, a rust preventive, a raw material for intercalation and the like.

BACKGROUND ART

Zirconium phosphate-based inorganic ion exchangers are utilized in various applications by virtue of their features.

The zirconium phosphate-based inorganic ion exchangers include amorphous ones, and crystalline ones having a two-dimensional layer structure or three-dimensional network structure. Above all, $Zr_2(HPO_4)_2 \cdot nH_2O$, which is a layered zirconium phosphate having a two-dimensional layer structure, is excellent in ion exchange performance, heat resistance, chemical resistance, radiation resistance and the like, and is applied to a trapping agent for impurity ions in electronic materials, immobilization of radioactive waste, a solid electrolyte, a gas adsorbing/separating agent, a rust preventive, a catalyst, an intercalation carrier, a raw material for antibacterials and the like.

Hitherto, various types of layered phosphates have been known and various types of synthesis methods thereof have also been known. For example, there are $Zr(HPO_4)_2 \cdot H_2O$, $Zr(HPO_4)_2 \cdot 2H_2O$, $Ti(HPO_4) \cdot H_2O$, $Ti(HPO_4)_2 \cdot 2H_2O$, $Hf(HPO_4)_2 \cdot H_2O$, and $Sn(HPO_4)_2 \cdot 2H_2O$ (for example, see Patent Document 1), and $M(IV)(HPO_4)_x \cdot nH_2O$ (where M(IV) is a tetravalent metal) (for example, see Patent Document 2).

Above all, layered zirconium phosphates are easy to synthesize and excellent in performance and the like, and thus various manufacturing methods thereof have been proposed. For example, there are Patent Document 3, Patent Document 4 and Patent Document 5. Synthesis methods for layered zirconium phosphates include a hydrothermal method in which raw materials are mixed in water or in a state of containing water, and thereafter pressurized and heated to effect the synthesis, and a wet method in which raw materials are mixed in water, and thereafter heated at atmospheric pressure to effect the synthesis.

LSIs, ICs, hybrid ICs, transistors, diodes, thyristors and hybrid components thereof are sealed with an epoxy resin, for example. Epoxy resins are also used as adhesives for flexible printed wiring boards which have recently been demanded increasingly. Such sealing materials for electronic components are required to suppress failure caused by ionic impurities originating from raw materials or moisture invading from outside, and to have various characteristics including flame retardancy, high adhesiveness, crack resistance and electric properties including high volume resistivity.

Epoxy resins that are frequently used as electronic component sealing materials are composed of an epoxy compound as the main component, and additionally an epoxy compound curing agent, a curing accelerator, an inorganic filler, a flame retardant, a pigment, a silane coupling agent and the like.

Further, recent higher integration of semiconductors has brought about earlier generation of corrosion of aluminum due to reduction of the aluminum interconnect width on IC chips. This corrosion is promoted mainly by moisture invading an epoxy resin used as a sealing material. Since more heat is generated upon use due to the reduction of the interconnect width, a large amount of a flame retardant such as antimony oxide, a brominated epoxy resin and an inorganic hydroxide is added to the epoxy resin, thereby further promoting corrosion of interconnects made of aluminum or the like.

In flexible printed wiring boards, migration of copper interconnects is generated earlier for a similar reason.

A composition is known which comprises an epoxy resin used for printed wiring boards, blended with an inorganic ion exchanger such as a cation exchanger, an anion exchanger or an amphoteric ion exchanger (for example, see Patent Document 6).

A printed board is known which is made from aramid fibers impregnated with an epoxy or polyphenylene oxide resin and an ion trapping agent. The ion trapping agent is exemplified by an ion exchange resin and an inorganic ion exchanger; and as the inorganic ion exchanger, an antimony-bismuth-based one and a zirconium-based one are described (for example, see Patent Document 7).

An insulating varnish containing an ion trapping agent is known; and a multilayer printed wiring board is fabricated using the insulating varnish. The ion trapping agent is exemplified by activated carbon, zeolite, silica gel, activated alumina, activated clay, hydrated antimony pentoxide, zirconium phosphate and hydrotalcite (for example, see Patent Document 8).

An adhesive film for multilayer wiring boards is known in which an inorganic ion adsorbent is blended. The inorganic ion adsorbent is exemplified by activated carbon, zeolite, silica gel, activated alumina, activated clay, hydrated antimony pentoxide, zirconium phosphate and hydrotalcite (for example, see Patent Document 9).

An epoxy resin adhesive containing an ion trapping agent is known. The ion trapping agent is exemplified by an anion exchanger and a cation exchanger (for example, see Patent Document 10).

A conductive epoxy resin paste is known which contains an ion trapping agent, silver powder and the like. The ion trapping agent is exemplified by hydrated bismuth nitrate, magnesium aluminum hydrotalcite and antimony oxide (for example, see Patent Document 11).

Patent Document 1: Japanese Patent Laid-Open No. 03-150214
Patent Document 2: Japanese Patent Laid-Open No. 59-102808
Patent Document 3: Japanese Patent Laid-Open No. 60-103008
Patent Document 4: Japanese Patent Laid-Open No. 62-226807
Patent Document 5: Japanese Patent Laid-Open No. 61-270204
Patent Document 6: Japanese Patent Laid-Open No. 05-140419
Patent Document 7: Japanese Patent Laid-Open No. 09-314758
Patent Document 8: Japanese Patent Laid-Open No. 10-287830

Patent Document 9: Japanese Patent Laid-Open No. 10-330696

Patent Document 10: Japanese Patent Laid-Open No. 10-13011

Patent Document 11: Japanese Patent Laid-Open No. 10-7763

DISCLOSURE OF THE INVENTION

Problems to be Solved by the Invention

It is an object of the present invention to provide a crystalline layered zirconium phosphate which is an ion exchanger particle excellent in heat resistance and chemical resistance and utilizable as a trapping agent for impurity ions in electronic materials, a raw material for antibacterials, a deodorant, a discoloration inhibitor, a rust preventive, a raw material for intercalation and the like, and excellent in various processabilities.

Means for Solving the Problems

As a result of exhaustive studies to solve the problem described above, the present inventor has found that the problem can be solved by use of a novel layered zirconium phosphate represented by the general formula (1) shown below:

wherein a and b are positive numbers satisfying 3b−a=4; b is a number satisfying 2<b≦2.3; x is a positive number satisfying 0≦x<1; and n is a positive number satisfying 0≦n≦2, and thus has achieved the present invention.

That is, the present invention provides:

<1> A layered zirconium phosphate compound represented by the general formula (1) shown below:

wherein a and b are positive numbers satisfying 3b−a=4; b is a number satisfying 2<b≦2.3; x is a positive number satisfying 0≦x<1; and n is a positive number satisfying 0≦n≦2;

<2> The layered zirconium phosphate compound according to the item 1 described above, wherein the general formula (1) is represented by the general formula (2) shown below:

wherein a and b are positive numbers satisfying 3b−a=4; b is a number satisfying 2<b≦2.3; and n is a positive number satisfying 0≦n≦2;

<3> The layered zirconium phosphate according to the item 1 described above, wherein x in the general formula (1) is a number satisfying 0<x≦0.2;

<4> The layered zirconium phosphate according to any one of the items 1 to 3 described above, which is synthesized by a wet atmospheric pressure synthesis method;

<5> A resin composition for sealing electronic components, which comprises the layered zirconium phosphate compound according to any one of the items 1 to 4 described above;

<6> The resin composition for sealing electronic components according to the item 5 described above, which further comprises an inorganic anion exchanger;

<7> A resin for sealing electronic components, which is obtained by curing the resin composition for sealing electronic components according to the item 5 or 6 described above;

<8> An electronic component, which is obtained by sealing a device with the resin composition for sealing electronic components according to the item 5 or 6 described above;

<9> A varnish, adhesive or paste which comprises the layered zirconium phosphate according to any one of the items 1 to 4 described above;

<10> The varnish, adhesive or paste according to the item 9 described above, which further comprises an inorganic anion exchanger; and <11> A product which comprises the varnish, adhesive or paste according to the item 9 or 10 described above.

Advantages of the Invention

The layered zirconium phosphate of the present invention can be used as an inorganic ion exchanger. The layered zirconium phosphate has a higher ion exchange performance and can be applied to a wider range of fields compared with a usual layered zirconium phosphate $ZrH_2(PO_4)_2 \cdot nH_2O$.

BEST MODE FOR CARRYING OUT THE INVENTION

Hereinafter, the present invention will be described. Here, "%" indicates % by mass.

The novel layered zirconium phosphate of the present invention is represented by the general formula (1) shown above.

In the present invention, b in the formula (1) is a positive number satisfying 2<b≦2.3, preferably 2.01≦b≦2.1, and more preferably 2.02≦b≦2.06. The layered zirconium phosphate of the formula (1) containing a larger amount of phosphoric acid has a higher ion exchange performance, but deteriorates other physical properties, for example, becomes easier to elute phosphate ions.

In the present invention, x in the formula (1) is a positive number satisfying 0≦x<1. That is, the layered zirconium phosphate of the present invention includes one in which x in the formula (1) is 0 and one in which x therein satisfies 0<x<1. The layered zirconium phosphate in which x therein satisfies 0<x<1 is preferably one satisfying 0<x≦0.2, more preferably 0.005≦x≦0.1, and still more preferably 0.005≦x<0.03. In the present invention, a higher content of hafnium provides a higher ion exchange performance, but there exists a radioactive isotope in hafnium, and thus when the layered zirconium phosphate is used for electronic components, a too high content of hafnium may adversely affect the electronic components.

In the present invention, n in the formula (1) is a positive number satisfying 0≦n≦2; n is preferably less than 1, more preferably 0.01 to 0.5, and still more preferably 0.03 to 0.3. When n exceeds 2, the layered zirconium phosphate contains a large absolute amount of moisture, and thus may cause foaming, hydrolysis or the like during processing and the like.

The synthesis method for the layered zirconium phosphate of the present invention is a wet method in which various raw materials are reacted in an aqueous solution. Specifically, it is synthesized by mixing an aqueous solution containing a zirconium compound and an aqueous solution containing phosphoric acid and/or its salt to produce a precipitate, and aging the precipitate.

When the synthesis is conducted, if desired, an oxalic acid compound can be added. The addition of the oxalic acid compound enables an efficient synthesis with higher speed and little waste of raw materials, and thus the addition is basically preferable.

The aging may be carried out at ambient temperature, and is preferably carried out in a wet atmosphere at atmospheric pressure at 90° C. or more in order to accelerate the aging, and the synthesis may be carried out under a hydrothermal condition which means a condition of an atmosphere at a pressure higher than the atmospheric pressure and a temperature exceeding 100° C. When the layered zirconium phosphate of the present invention is synthesized under the hydrothermal condition, the synthesis is preferably carried out at 130° C. or less in view of manufacturing costs.

The time taken for synthesis of the layered zirconium phosphate of the present invention is not particularly limited as long as the layered zirconium phosphate can be synthesized in the time period. For example, phosphoric acid and/or its salt and a zirconium compound are mixed to produce a precipitate, and thereafter the precipitate is aged to obtain a layered zirconium phosphate. The aging time depends on the aging temperature. For example, for the aging at 90° C., the aging time is preferably 4 hours or more. Even if the aging is carried out for 24 hours or more, the content of the layered zirconium phosphate is likely to reach the limit.

The thus-synthesized layered zirconium phosphate is further filtered, well washed with water, dried and pulverized to obtain a white microparticulate layered zirconium phosphate.

Zirconium compounds usable as a synthesis raw material for the layered zirconium phosphate of the present invention are exemplified by zirconium nitrate, zirconium acetate, zirconium sulfate, zirconium carbonate, basic zirconium sulfate, zirconium oxysulfate and zirconium oxychloride, and are preferably zirconium nitrate, zirconium acetate, zirconium sulfate, zirconium carbonate, basic zirconium sulfate, zirconium oxysulfate and zirconium oxychloride, and in consideration of reactivity and profitability, more preferably zirconium oxychloride.

Phosphoric acid or phosphates usable as a synthesis raw material for the layered zirconium phosphate of the present invention are exemplified by phosphoric acid, sodium phosphate, potassium phosphate and ammonium phosphate, and are preferably phosphoric acid, and more preferably phosphoric acid having a high concentration of about 75% to 85% by mass.

Oxalic acid compounds usable as a synthesis raw material for the layered zirconium phosphate of the present invention are exemplified by oxalic acid dihydrate, ammonium oxalate and ammonium hydrogen oxalate, and are preferably oxalic acid dihydrate.

The blending proportions of the synthesis raw materials for the layered zirconium phosphate of the present invention will be described hereinafter.

The blending proportion of the phosphoric acid or phosphate is more than 2, preferably 2.05 or more, and more preferably 2.1 or more in terms of molar charge ratio relative to the zirconium compound. The blending proportion of the phosphoric acid or phosphate may be very excessive to the zirconium compound, but in consideration of conductivity of supernatant, the molar charge ratio is 3 or less, preferably 2.9 or less, and more preferably 2.6 or less. If the proportion is in the above range, the layered zirconium phosphate of the present invention can be manufactured, and thus is preferable.

The blending proportion of the oxalic acid for synthesis of the layered zirconium phosphate of the present invention is 2.5 to 3.5, more preferably 2.7 to 3.2, and still more preferably 2.8 to 3.0 in terms of molar ratio relative to the zirconium compound. In the present invention, the above molar ratio facilitates the synthesis of the layered zirconium phosphate of the present invention, and thus is preferable.

The solid content in a reaction slurry for synthesis of the layered zirconium phosphate of the present invention is desirably 3% by weight or more, and in consideration of efficiency including profitability, preferably 7% to 15%. In the present invention, this concentration facilitates synthesis of the layered zirconium phosphate of the present invention, and thus is preferable.

Specific preferable examples of the layered zirconium phosphate of the present invention are as follows.

$ZrH_{2.03}(PO_4)_{2.01} \cdot 0.05H_2O$ $ZrH_{2.06}(PO_4)_{2.02} \cdot 0.05H_2O$ $ZrH_{2.12}(PO_4)_{2.04} \cdot 0.05H_2O$ $ZrH_{2.24}(PO_4)_{2.08} \cdot 0.05H_2O$ $Zr_{0.99}Hf_{0.01}H_{2.03}(PO_4)_{2.01} \cdot 0.05H_2O$ $Zr_{0.99}Hf_{0.01}H_{2.06}(PO_4)_{2.02} \cdot 0.05H_2O$ $Zr_{0.99}Hf_{0.01}H_{2.12}(PO_4)_{2.04} \cdot 0.05H_2O$ $Zr_{0.99}Hf_{0.01}H_{2.24}(PO_4)_{2.08} \cdot 0.05H_2O$ $Zr_{0.98}Hf_{0.02}H_{2.03}(PO_4)_{2.01} \cdot 0.05H_2O$ $Zr_{0.98}Hf_{0.02}H_{2.06}(PO_4)_{2.02} \cdot 0.05H_2O$ $Zr_{0.98}Hf_{0.02}H_{2.12}(PO_4)_{2.04} \cdot 0.05H_2O$ $Zr_{0.98}Hf_{0.02}H_{2.24}(PO_4)_{2.08} \cdot 0.05H_2O$ $Zr_{0.97}Hf_{0.03}H_{2.03}(PO_4)_{2.01} \cdot 0.05H_2O$ $Zr_{0.94}Hf_{0.06}H_{2.03}(PO_4)_{2.01} \cdot 0.05H_2O$ $Zr_{0.9}Hf_{0.1}H_{2.03}(PO_4)_{2.01} \cdot 0.05H_2O$ Median Diameter The median diameter used in the present invention is determined by dispersing a layered zirconium phosphate in water and measuring it by a laser diffraction particle size analyzer.

The median diameter of the layered zirconium phosphate in the present invention is 0.05 to 5 μm, preferably 0.2 to 2.0 μm, and more preferably 0.3 to 1.5 μm. Further, in consideration of processability, not only the average particle diameter, but also the maximum particle diameter and the degree of scattering are important; and the maximum particle diameter of 10 μm or less exhibits the present advantages more effectively, and thus is preferable.

Ion-Exchange Capacity

The ion-exchange capacity in the present invention is measured using a sodium hydroxide aqueous solution. The measurement carried out involved charging 1 g of a sample and 50 ml of a 0.1 mol/L sodium hydroxide aqueous solution in a polyethylene bottle of 100 ml, shaking the mixture at 40° C. for 20 hours, and thereafter measuring the sodium ion concentration of the supernatant by ICP. A value obtained by measuring the sodium ion concentration through the same procedures as above except no sample was charged was defined as the blank value to calculate the ion-exchange capacity.

The ion-exchange capacity of the layered zirconium phosphate of the present invention is 3.0 meq/g or more, more preferably 4.0 meq/g or more, and still more preferably 5.0 meq/g or more and 8 meq/g or less.

Ion-Exchange Rate

The ion-exchange rate in the present invention is measured using a neutral sodium chloride aqueous solution. The measurement carried out involved charging 1 g of a sample and 50 ml of a 0.05 mol/L sodium chloride aqueous solution in a polyethylene bottle of 100 ml, shaking the mixture at 40° C. for 20 hours, and thereafter measuring the sodium ion concentration of the supernatant by ICP. A value obtained by measuring the sodium ion concentration through the same procedures as above except no sample was charged was defined as the blank value to calculate the ion-exchange rate. That is, if sodium ions in the supernatant are all adsorbed to an anion exchanger, and are absent, the ion-exchange rate is 100%.

The ion-exchange rate of the layered zirconium phosphate of the present invention is 50% or more, more preferably 55% or more, and still more preferably 60% or more.

Conductivity

The conductivity of supernatant in the present invention is measured by adding a deionized water to a sample and stirring the mixture, and measuring the conductivity of the supernatant thereof. The measurement carried out involved charging 0.5 g of a sample and 50 ml of a deionized water in a polypropylene bottle of 100 ml, maintaining the mixture at 90° C. for 20 hours, and thereafter measuring the conductivity of the supernatant.

The conductivity of the supernatant of the layered zirconium phosphate of the present invention is 200 µS/cm or less, more preferably 170 µS/cm or less, and still more preferably 140 µS/cm or less and 30 µS/cm or more.

α Dose

The αdose in the present invention is a value obtained by measuring a sample by a low-level α-ray measuring device.

The α dose of the layered zirconium phosphate of the present invention is preferably 0.15 $C/cm^2 \cdot H$ or less, more preferably 0.11 $C/cm^2 \cdot H$ or less, and still more preferably 0.08 $C/cm^2 \cdot H$ or less and 5 $mC/cm^2 \cdot H$ or more. A high α dose in the present invention may cause malfunctions of electronic components.

For example, the layered zirconium phosphate of the present invention is an ion exchanger having an anion exchange capacity of 3.0 meq/g or more, a conductivity of supernatant of 200 µS/cm or less and an α dose of 0.15 $C/cm^2 \cdot H$ or less.

Since the layered zirconium phosphate of the present invention is a powder, it may be used as it is or used after processed. The layered zirconium phosphate of the present invention may be in a form of, for example, suspension, granules, paper-like bodies, pellets, molded articles such as sheets and films, sprays, porous bodies and fibers. These may further be processed into coatings, nonwoven fabrics, foamed sheets, paper, plastics, inorganic plates and the like.

The layered zirconium phosphate of the present invention is excellent in ion-exchange performance, heat resistance, chemical resistance, radiation resistance and the like, and can be applied to a metal trapping agent for water treatment, an ion trapping agent for electronic components, immobilization of radioactive wastes, a solid electrolyte, a gas adsorbing/separating agent, a deodorant, a discoloration inhibitor, a rust preventive, a catalyst, an intercalation carrier, a raw material for antibacterials and the like, and can also be applied to a pigment, an antiblocking agent and the like because it is a physically/chemically stable white microparticle.

The Resin Composition for Sealing Electronic Components

The resin used in the resin compositions for sealing electronic components containing the layered zirconium phosphate of the present invention may be thermosetting resins such as phenol resins, urea resins, melamine resins, unsaturated polyester resins and epoxy resins, or thermoplastic resins such as polyethylene, polystyrene, vinyl chloride and polypropylene, and are preferably thermosetting resins. The thermosetting resins used in the resin composition for sealing electronic components of the present invention are preferably phenol resins and epoxy resins, and most preferably epoxy resins.

The Epoxy Resin Composition for Sealing Electronic Components

The epoxy resin usable in the present invention is not limited as long as they are used as resins for sealing electronic components. For example, any kind of resins that have two or more epoxy groups in one molecule and are curable can be used, including those that have been used as molding materials, such as phenol novolac epoxy resins, bisphenol A epoxy resins, bisphenol F epoxy resins and alicyclic epoxy resins. For improving moisture resistance of the composition of the present invention, it is preferable to use an epoxy resin which has a chloride ion content of 10 ppm or less and a hydrolysable chlorine content of 1,000 ppm or less.

In the present invention, the resin composition for sealing electronic components preferably contains a curing agent and a curing accelerator.

As the curing agent used in the present invention, any of those known as curing agents for epoxy resin compositions can be used. Preferable specific examples are acid anhydrides, amine curing agents and novolac curing agents.

As the curing accelerator used in the present invention, any of those known as curing accelerators for epoxy resin compositions can be used. Preferable specific examples are amine accelerators, phosphorus accelerators and imidazole accelerators.

The resin compositions for sealing electronic components of the present invention may be blended, as required, with components that are known to be blended with molding resins. Such components are exemplified by inorganic fillers, flame retardants, coupling agents for inorganic fillers, colorants and releasing agents. These components are known as components blended with epoxy resins for molding. Preferable specific examples of inorganic fillers include crystalline silica powder, quartz glass powder, fused silica powder, alumina powder and talc. Among these, crystalline silica powder, quartz glass powder and fused silica powder are inexpensive and preferable. Examples of flame retardants are antimony oxide, halogenated epoxy resins, magnesium hydroxide, aluminum hydroxide, red phosphorus compounds and phosphate compounds; examples of coupling agents are silane ones and titanium ones; and examples of releasing agents are waxes such as aliphatic paraffins and higher aliphatic alcohols.

In addition to the above-mentioned components, a reactive diluent, a solvent, a thixotropy-imparting agent and the like may be blended. Specifically, the reactive diluent is exemplified by butylphenyl glycidyl ether; the solvent is exemplified by methyl ethyl ketone; and the thixotropy-imparting agent is exemplified by organically modified bentonite.

The preferable blending proportion of the layered zirconium phosphate of the present invention is 0.1 to 10 parts by mass, more preferably 1 to 5 parts by mass with respect to 100 parts by mass of a resin composition for sealing electronic components. With the proportion of 0.1 part by mass or more, anion removability and moisture resistance reliability can clearly be observed. In contrast, with the proportion exceeding 10 parts by mass, the effect often reaches the limit.

The use of the layered zirconium phosphate of the present invention in combination with an inorganic anion exchanger can increases the cation trapping capability of the layered zirconium phosphate of the present invention, and expects to have an effect of trapping anionic ions. The inorganic anion exchanger is an inorganic substance having anion exchangeability.

The blending proportion of the layered zirconium phosphate of the present invention to the inorganic anion exchanger is not especially limited, but is preferably 100:0 to 20:80 in terms of mass ratio. The layered zirconium phosphate of the present invention and the anion exchanger may be separately blended, or collectively blended as a mixture obtained by previously mixing these components homogeneously, when a resin composition for sealing electronic components is prepared. A preferable blending method is that using the mixture because this allows the effect of the combined use of these components to be further enhanced.

Specific examples of the inorganic anion exchangers are preferably hydrotalcite compounds and calcined products thereof, hydrous bismuth oxide, bismuth hydroxide nitrate, hydrous zirconium hydroxide, hydrous magnesium hydroxide and hydrous aluminum hydroxide.

The resin composition for sealing electronic components of the present invention can easily be obtained by mixing the above-mentioned raw materials by a known method. For example, the above-mentioned raw materials are suitably mixed, and the mixture is kneaded under heating in a kneading machine to obtain a semicured resin composition; and the semicured resin composition is cooled, and then pulverized by a known means, and as required, formed into tablets for use.

The layered zirconium phosphate of the present invention can be used for various applications such as sealing, coating and insulation of electronic components or electrical components.

The layered zirconium phosphate of the present invention can further be used as stabilizers for resins such as vinyl chloride, rust preventives and the like.

The resin composition for sealing electronic components, which contains the layered zirconium phosphate of the present invention, can be used for, for example, supporting members such as lead frames, wired tape carriers, wiring boards, glass and silicon wafers on which devices including active devices such as semiconductor chips, transistors, diodes and thyristors, and passive devices such as capacitors, resistors and coils are mounted. The resin composition for sealing electronic components of the present invention can also be used effectively for printed circuit boards. The epoxy resin composition for sealing electronic components, which contains the layered zirconium phosphate of the present invention, can be used similarly.

As a method for sealing a device using the present resin composition for sealing electronic components or the present epoxy resin composition for sealing electronic components, a low-pressure transfer molding method is most common, but an injection molding method, a compression molding method or the like may be used.

Application to Wiring Boards

Wiring boards are produced by forming a substrate for printed wiring with a thermosetting resin such as epoxy resins and bonding a copper foil or the like onto the substrate, and then subjecting the assembly to an etching process and the like to fabricate circuits. However, in recent years, there arise the problems of corrosion and insulation failure due to high densification of circuits, multi-layering of circuits, thickness reduction of insulation layers and the like. When wiring boards are produced, the addition of the layered zirconium phosphate of the present invention can prevent such corrosion. Further, the addition of the layered zirconium phosphate of the present invention to insulation layers for wiring boards can also prevent corrosion and the like of wiring boards. Thus, wiring boards containing the layered zirconium phosphate of the present invention can suppress the occurrence of defective products caused by corrosion and the like. The layered zirconium phosphate of the present invention is preferably added in an amount of 0.1 to 5 parts by mass relative to 100 parts by mass of the solid content of the resin of the wiring board or insulation layer for the wiring board. An inorganic anion exchanger may be contained therein.

Addition to Adhesives

Electronic components and the like are mounted on a substrate of wiring boards or the like by use of an adhesive. The addition of the layered zirconium phosphate of the present invention to the adhesive used in this instance can suppress the occurrence of defective products caused by corrosion and the like. The layered zirconium phosphate of the present invention is preferably added in an amount of 0.1 to 5 parts by mass relative to 100 parts by mass of the solid content of the resin of the adhesive. An inorganic anion exchanger may be contained therein.

The addition of the layered zirconium phosphate of the present invention to a conductive adhesive and the like used when electronic components and the like are connected or wired on wiring boards can suppress defects caused by corrosion and the like. The conductive adhesive is exemplified by those containing a conductive metal such as silver. The layered zirconium phosphate of the present invention is preferably added in an amount of 0.1 to 5 parts by mass relative to 100 parts by mass of the solid content of the resin of the conductive adhesive. An inorganic anion exchanger may be contained therein.

Addition to Varnishes

Electrical products, printed wiring boards, electronic components and the like can be produced using a varnish containing the layered zirconium phosphate of the present invention. The varnish is exemplified by those containing a thermosetting resin such as an epoxy resin as a main component. The layered zirconium phosphate of the present invention is preferably added in an amount of 0.1 to 5 parts by mass relative to 100 parts by mass of the solid content of the resin of the varnish. An inorganic anion exchanger may be contained therein.

Addition to Pastes

The layered zirconium phosphate of the present invention can be added to a paste containing silver powder and the like. The paste refers to those used as an auxiliary agent for soldering and the like for improving adhesion between metals to be connected with each other. Hence, generation of corrosive substances from the paste can be inhibited. The layered zirconium phosphate of the present invention is preferably added in an amount of 0.1 to 5 parts by mass relative to 100 parts by mass of the solid content of the resin in the paste. An inorganic anion exchanger may be contained therein.

Embodiments

Embodiments of the layered zirconium phosphate of the present invention include, for example, the following two.

A layered zirconium phosphate represented by the formula (1), which is synthesized by a wet synthesis method under atmospheric pressure in which phosphoric acid or a phosphate is added in a molar charge ratio of more than 2 but not more than 3 relative to a zirconium compound.

A layered zirconium phosphate represented by the formula (1), which is synthesized by a wet synthesis method under atmospheric pressure in which an oxalic acid compound is used.

EXAMPLES

Hereinafter, the present invention will be described by way of Examples, but the present invention is not limited thereto. Here, "%" indicates % by mass; and "part(s)" indicates part(s) by mass.

Example 1

0.272 mol of zirconium oxychloride octahydrate was dissolved in 850 ml of deionized water, and thereafter, 0.788 mol of oxalic acid dihydrate was dissolved therein. 0.57 mol of phosphoric acid was added to the solution under stirring. The solution was stirred and refluxed for 8 hours. After cooling, the obtained precipitate was well washed with water, and thereafter dried at 105° C. to obtain a zirconium phosphate. As a result of measurement of the obtained zirconium phosphate, it was confirmed to be a layered zirconium phosphate.

The composition formula of the layered zirconium phosphate was calculated through ICP measurement of a solution obtained by boiling and dissolving the layered zirconium phosphate in a hydrofluoric acid-added nitric acid. As a result, the composition formula was:

$$ZrH_{2.03}(PO_4)_{2.01} \cdot 0.05H_2O.$$

Measurement result of the median diameter (a laser diffraction particle size distribution analyzer, HORIBA Ltd., LA-700) of the layered zirconium phosphate was 0.94 µm.

Example 2

0.272 mol of zirconium oxychloride octahydrate was dissolved in 850 ml of deionized water, and thereafter, 0.788 mol of oxalic acid dihydrate was dissolved therein. 0.60 mol of phosphoric acid was added to the solution under stirring. The solution was stirred and refluxed for 8 hours. After cooling, the obtained precipitate was well washed with water, and thereafter dried at 105° C. to obtain a zirconium phosphate. As a result of measurement of the obtained zirconium phosphate, it was confirmed to be a layered zirconium phosphate.

The composition formula and others of the layered zirconium phosphate were measured in the same manner as in Example 1. The composition formula was:

$$ZrH_{2.06}(PO_4)_{2.02} \cdot 0.05H_2O,$$

and the median diameter was 0.96 µm.

Example 3

0.272 mol of zirconium oxychloride octahydrate was dissolved in 850 ml of deionized water, and thereafter, 0.788 mol of oxalic acid dihydrate was dissolved therein. 0.70 mol of phosphoric acid was added to the solution under stirring. The solution was stirred and refluxed for 8 hours. After cooling, the obtained precipitate was well washed with water, and thereafter dried at 105° C. to obtain a zirconium phosphate. As a result of measurement of the obtained zirconium phosphate, it was confirmed to be a layered zirconium phosphate.

The composition formula and others of the layered zirconium phosphate were measured in the same manner as in Example 1. The composition formula was:

$$ZrH_{2.12}(PO_4)_{2.04} \cdot 0.05H_2O,$$

and the median diameter was 0.93 µm.

Example 4

0.272 mol of zirconium oxychloride octahydrate containing 0.18% of hafnium was dissolved in 850 ml of deionized water, and thereafter, 0.788 mol of oxalic acid dihydrate was dissolved therein. 0.57 mol of phosphoric acid was added to the solution under stirring. The solution was stirred and refluxed for 8 hours. After cooling, the obtained precipitate was well washed with water, and thereafter dried at 105° C. to obtain a zirconium phosphate. As a result of measurement of the obtained zirconium phosphate, it was confirmed to be a layered zirconium phosphate.

The composition formula and others of the layered zirconium phosphate were measured in the same manner as in Example 1. The composition formula was:

$$Zr_{0.99}Hf_{0.01}H_{2.03}(PO_4)_{2.01} \cdot 0.05H_2O,$$

and the median diameter was 1.0 µm.

Example 5

0.272 mol of zirconium oxychloride octahydrate containing 0.18% of hafnium was dissolved in 850 ml of deionized water, and thereafter, 0.788 mol of oxalic acid dihydrate was dissolved therein. 0.60 mol of phosphoric acid was added to the solution under stirring. The solution was stirred and refluxed for 8 hours. After cooling, the obtained precipitate was well washed with water, and thereafter dried at 105° C. to obtain a zirconium phosphate. As a result of measurement of the obtained zirconium phosphate, it was confirmed to be a layered zirconium phosphate.

The composition formula and others of the layered zirconium phosphate were measured in the same manner as in Example 1. The composition formula was:

$$Zr_{0.99}Hf_{0.01}H_{2.06}(PO_4)_{2.02} \cdot 0.05H_2O,$$

and the median diameter was 0.95 µm.

Example 6

0.272 mol of zirconium oxychloride octahydrate containing 0.54% of hafnium was dissolved in 850 ml of deionized water, and thereafter, 0.788 mol of oxalic acid dihydrate was dissolved therein. 0.57 mol of phosphoric acid was added to the solution under stirring. The solution was stirred and refluxed for 8 hours. After cooling, the obtained precipitate was well washed with water, and thereafter dried at 105° C. to obtain a zirconium phosphate. As a result of measurement of the obtained zirconium phosphate, it was confirmed to be a layered zirconium phosphate.

The composition formula and others of the layered zirconium phosphate were measured in the same manner as in Example 1. The composition formula was:

$$Zr_{0.97}Hf_{0.03}H_{2.03}(PO_4)_{2.01} \cdot 0.05H_2O,$$

and the median diameter was 0.95 µm.

Comparative Example 1

0.272 mol of zirconium oxychloride octahydrate was dissolved in 850 ml of deionized water, and thereafter, 0.788 mol of oxalic acid dihydrate was dissolved therein. 0.544 mol of phosphoric acid was added to the solution under stirring. The solution was stirred and refluxed for 8 hours. After cooling, the obtained precipitate was well washed with water, and thereafter dried at 105° C. to obtain a zirconium phosphate. As a result of measurement of the obtained zirconium phosphate, it was confirmed to be a layered zirconium phosphate.

The composition formula and others of the layered zirconium phosphate were measured in the same manner as in Example 1. The composition formula was:

$ZrH_2(PO_4)_2 \cdot 0.05H_2O$, and the median diameter was 1.0 μm.

Comparative Example 2

0.272 mol of zirconium oxychloride octahydrate was dissolved in 850 ml of deionized water, and thereafter, 0.788 mol of oxalic acid dihydrate was dissolved therein. 0.5 mol of phosphoric acid was added to the solution under stirring. The solution was stirred and refluxed for 8 hours. After cooling, the obtained precipitate was well washed with water, and thereafter dried at 105° C. to obtain a zirconium phosphate. As a result of measurement of the obtained zirconium phosphate, it was confirmed to be a layered zirconium phosphate.

The composition formula and others of the layered zirconium phosphate were measured in the same manner as in Example 1. The composition formula was:

$ZrH_{1.97}(PO_4)_{1.99} \cdot 0.05H_2O$, and the median diameter was 1.1 μm.

Comparative Example 3

0.272 mol of zirconium oxychloride octahydrate was dissolved in 850 ml of deionized water, and thereafter, 0.788 mol of oxalic acid dihydrate was dissolved therein. 0.85 mol of phosphoric acid was added to the solution under stirring. The solution was stirred and refluxed for 8 hours. After cooling, the obtained precipitate was well washed with water, and thereafter dried at 105° C. to obtain a zirconium phosphate. As a result of measurement of the obtained zirconium phosphate, it was confirmed to be a layered zirconium phosphate.

The composition formula and others of the layered zirconium phosphate were measured in the same manner as in Example 1. The composition formula was:

$ZrH_{2.36}(PO_4)_{2.12} \cdot 0.05H_2O$, and the median diameter was 1.0 μm.

Example 7

0.272 mol of zirconium oxychloride octahydrate containing 1.2% of hafnium was dissolved in 850 ml of deionized water, and thereafter, 0.788 mol of oxalic acid dihydrate was dissolved therein. 0.57 mol of phosphoric acid was added to the solution under stirring. The solution was stirred and refluxed for 8 hours. After cooling, the obtained precipitate was well washed with water, and thereafter dried at 105° C. to obtain a zirconium phosphate. As a result of measurement of the obtained zirconium phosphate, it was confirmed to be a layered zirconium phosphate.

The composition formula and others of the layered zirconium phosphate were measured in the same manner as in Example 1. The composition formula was:

$Zr_{0.94}Hf_{0.06}H_{2.03}(PO_4)_{2.01} \cdot 0.05H_2O$, and the median diameter was 1.0 μm.

Example 8

0.272 mol of zirconium oxychloride octahydrate containing 2.0% of hafnium was dissolved in 850 ml of deionized water, and thereafter, 0.788 mol of oxalic acid dihydrate was dissolved therein. 0.57 mol of phosphoric acid was added to the solution under stirring. The solution was stirred and refluxed for 8 hours. After cooling, the obtained precipitate was well washed with water, and thereafter dried at 105° C. to obtain a zirconium phosphate. As a result of measurement of the obtained zirconium phosphate, it was confirmed to be a layered zirconium phosphate.

The composition formula and others of the layered zirconium phosphate were measured in the same manner as in Example 1. The composition formula was:

$Zr_{0.9}Hf_{0.1}H_{2.03}(PO_4)_{2.01} \cdot 0.05H_2O$, and the median diameter was 1.0 μm.

<Measurement of Ion-Exchange Capacity>

1.0 g of the layered zirconium phosphate obtained in Example 1 was added to 50 ml of a 0.1 mol/L sodium hydroxide aqueous solution, and stirred at 40° C. for 20 hours. The resultant solution was filtered out and the sodium concentration in the filtrate was measured to determine the ion-exchange capacity. Also the layered zirconium phosphates obtained in Examples 2 to 8 and Comparative Examples 1 to 5 were similarly tested to determine the ion-exchange capacities thereof.

These results are shown in Table 1.

<Measurement of Ion-Exchange Rate>

1.0 g of the layered zirconium phosphate obtained in Example 1 was added to 50 ml of a 0.05 mol/L sodium chloride aqueous solution, and stirred at 40° C. for 20 hours. The resultant solution was filtered out and the sodium concentration in the filtrate was measured to determine the ion-exchange rate. Also the layered zirconium phosphates obtained in Examples 2 to 8 and Comparative Examples 1 to 5 were similarly tested to determine the ion-exchange rates thereof.

These results are shown in Table 1.

<Measurement of Supernatant Conductivity>

0.5 g of the layered zirconium phosphate obtained in Example 1 was added to 50 ml of deionized water, and heated at 95° C. for 20 hours. The resultant solution was filtered out and the conductivity of the supernatant was measured. Also the layered zirconium phosphates obtained in Examples 2 to 8 and Comparative Examples 1 to 5 were similarly tested to determine the conductivities of the supernatants thereof.

These results are shown in Table 1.

<Measurement of α Dose>

The α dose of the layered zirconium phosphate obtained in Example 1 was measured by a low-level α-ray measuring device (Sumika Chemical Analysis Service, Ltd., LACS-4000M). Also the layered zirconium phosphates obtained in Examples 2 to 8 and Comparative Examples 1 to 5 were similarly tested to determine the α doses thereof.

These results are shown in Table 1.

TABLE 1

| | Ion-Exchange Capacity (meq/g) | Ion-Exchange Rate | Supernatant Conductivity (μS/cm) | α Dose (C/cm² · H) |
|---|---|---|---|---|
| Example 1 | 6.7 | 65% | 100 | 0.03 |
| Example 2 | 6.8 | 72% | 110 | 0.03 |
| Example 3 | 6.9 | 78% | 120 | 0.03 |
| Example 4 | 6.7 | 70% | 100 | 0.05 |
| Example 5 | 6.8 | 78% | 110 | 0.05 |
| Example 6 | 6.7 | 82% | 100 | 0.07 |
| Example 7 | 6.7 | 83% | 100 | 0.16 |
| Example 8 | 6.7 | 84% | 100 | 0.3 |
| Comparative Example 1 | 6.7 | 45% | 100 | 0.03 |

TABLE 1-continued

|  | Ion-Exchange Capacity (meq/g) | Ion-Exchange Rate | Supernatant Conductivity (μS/cm) | α Dose (C/cm² · H) |
|---|---|---|---|---|
| Comparative Example 2 | 6.5 | 35% | 80 | 0.03 |
| Comparative Example 3 | 7.1 | 85% | 300 | 0.03 |

As is clear from Table 1, the novel layered zirconium phosphates of the present invention are superior in ion exchangeability to the conventional layered zirconium phosphates.

Since the layered zirconium phosphates of Comparative Examples are inferior in ion exchangeability (Comparative Examples 1 and 2), or high in supernatant conductivity though superior in ion exchangeability (Comparative Example 3), they cannot be used in applications to electronic materials.

Hence, the novel layered zirconium phosphates of the present invention can be widely applied especially to the field of electronic materials.

Example 9

2 parts of the layered zirconium phosphate synthesized in Example 1 was added to 100 parts of an epoxy adhesive used for coverlays for flexible printed wiring boards to obtain an adhesive. The adhesive was applied onto a polyimide film, and brought to a B-stage to make a coverlay for flexible circuit boards.

Besides, a copper-clad board for flexible circuit boards, which had a base film made of a polyamide resin, was provided. The above-mentioned coverlay was attached to the surface of the copper-clad board, and bonded thereto by heat pressing to obtain a flexible board 1.

Example 10

A flexible board 2 was fabricated by the same operation as the flexible board 1, except for using the layered zirconium phosphate of Example 2 in place of the layered zirconium phosphate of Example 1.

Example 11

A flexible board 3 was fabricated by the same operation as the flexible board 1, except for using the layered zirconium phosphate of Example 3 in place of the layered zirconium phosphate of Example 1.

Example 12

A flexible board 4 was fabricated by the same operation as the flexible board 1, except for using the layered zirconium phosphate of Example 4 in place of the layered zirconium phosphate of Example 1.

Example 13

A flexible board 5 was fabricated by the same operation as the flexible board 1, except for using the layered zirconium phosphate of Example 5 in place of the layered zirconium phosphate of Example 1.

Example 14

A flexible board 6 was fabricated by the same operation as the flexible board 1, except for using the layered zirconium phosphate of Example 6 in place of the layered zirconium phosphate of Example 1.

Example 15

A flexible board 7 was fabricated by the same operation as the flexible board 1, except for using 1 part of the layered zirconium phosphate of Example 1 in combination with 1 part of an inorganic anion exchanger, $Bi(OH)_{2.65}(NO_3)_{0.35}$, in place of the layered zirconium phosphate of Example 1 alone.

Example 16

A flexible board 8 was fabricated by the same operation as the flexible board 1, except for using 1 part of the layered zirconium phosphate of Example 2 in combination with 1 part of an inorganic anion exchanger, $Bi(OH)_{2.65}(NO_3)_{0.35}$, in place of the layered zirconium phosphate of Example 1 alone.

Example 17

A flexible board 9 was fabricated by the same operation as the flexible board 1, except for using 1 part of the layered zirconium phosphate of Example 3 in combination with 1 part of an inorganic anion exchanger, $Bi(OH)_{2.65}(NO_3)_{0.35}$, in place of the layered zirconium phosphate of Example 1 alone.

Comparative Example 4

A comparative flexible board 1 was fabricated by the same operation as the flexible board 1, except for using the layered zirconium phosphate of Comparative Example 1 in place of the layered zirconium phosphate of Example 1.

Comparative Example 5

A comparative flexible board 2 was fabricated by the same operation as the flexible board 1, except for using the layered zirconium phosphate of Comparative Example 2 in place of the layered zirconium phosphate of Example 1.

Comparative Example 6

A comparative flexible board 3 was fabricated by the same operation as the flexible board 1, except for using the layered zirconium phosphate of Comparative Example 3 in place of the layered zirconium phosphate of Example 1.

Comparative Example 7

A comparative flexible board 4 was fabricated by the same operation as the flexible board 1, except for using no layered zirconium phosphate. That is, the comparative flexible board 4 contained no ion exchanger.

<Test of Extraction of Ions from Kneaded Resins>

3 g of the flexible board 1 and 30 ml of ion-exchange water were charged in a polytetrafluoroethylene pressure vessel, and heated at 125° C. for 100 hours. After cooling, water was taken out, and concentrations of sodium ions and copper ions dissolving in water were measured by ICP. The results are shown in Table 2. Conductivities of supernatants were measured, and the results are shown in Table 2.

Also, the flexible boards 2 to 9 and the comparative flexible boards 1 to 4 were similarly tested, and these results are shown in Table 2.

TABLE 2

| | Na Ion Concentration (ppm) | Cu Ion Concentration (ppm) | Conductivity µS/cm |
|---|---|---|---|
| Flexible Board 1 | 1.8 | 2.8 | 103 |
| Flexible Board 2 | 1.5 | 2.5 | 108 |
| Flexible Board 3 | 1.3 | 2.0 | 111 |
| Flexible Board 4 | 1.7 | 2.4 | 102 |
| Flexible Board 5 | 1.4 | 2.1 | 104 |
| Flexible Board 6 | 1.6 | 1.8 | 101 |
| Flexible Board 7 | 1.0 | 1.5 | 80 |
| Flexible Board 8 | 0.8 | 1.3 | 78 |
| Flexible Board 9 | 0.6 | 1.0 | 75 |
| Comparative Flexible Board 1 | 2.5 | 4.0 | 100 |
| Comparative Flexible Board 2 | 4.1 | 4.5 | 98 |
| Comparative Flexible Board 3 | 1.0 | 2.2 | 300 |
| Comparative Flexible Board 4 | 5.0 | 6.2 | 105 |

As is clear from Table 2, the novel layered zirconium phosphates of the present invention are superior in trapping performance for Na ions in the resin and Cu ions to the conventional layered zirconium phosphates.

Since the layered zirconium phosphates of the Comparative Examples are inferior in the ion trapping performance, or high in the supernatant conductivity though superior in the ion trapping performance, they cannot be used in applications to electronic materials.

Hence, the novel layered zirconium phosphates of the present invention can be widely applied especially to the field of electronic materials.

INDUSTRIAL APPLICABILITY

The novel layered zirconium phosphates of the present invention have an excellent ion exchangeability compared with the existing layered zirconium phosphates. Hence, the novel layered zirconium phosphates of the present invention can be widely used in various applications such as sealing, coating, insulation and the like of highly reliable electronic or electrical components. Further, the layered zirconium phosphates of the present invention can be used as a raw material for antibacterials, a deodorant, a discoloration inhibitor, a rust preventive and the like.

The invention claimed is:

1. A layered zirconium phosphate compound represented by the general formula (1) shown below:

$$Zr_{1-x}Hf_xH_a(PO_4)_b \cdot nH_2O \qquad (1)$$

wherein
a and b are positive numbers satisfying $3b-a=4$;
b is a number satisfying $2<b\sim2.3$;
x is a positive number satisfying $0\leq x<1$; and
n is a positive number satisfying $0\leq n\leq 2$.

2. The layered zirconium phosphate compound according to claim 1, wherein the general formula (1) is represented by the general formula (2) shown below:

$$ZrH_a(PO_4)_b \cdot nH_2O \qquad (2)$$

wherein a and b are positive numbers satisfying $3b-a=4$;
b is a number satisfying $2<b\leq 2.3$; and
n is a positive number satisfying $0\leq n\leq 2$.

3. The layered zirconium phosphate according to claim 1, wherein x in the general formula (1) is a number satisfying $0<x\leq 0.2$.

4. The layered zirconium phosphate according to claim 1, which is synthesized by a wet atmospheric pressure synthesis method.

5. A resin composition for sealing electronic components, which comprises the layered zirconium phosphate according to claim 1.

6. The resin composition for sealing electronic components according to claim 5, which further comprises an inorganic anion exchanger.

7. A resin for sealing electronic components, which is obtained by curing the resin composition for sealing electronic components according to claim 5.

8. An electronic component, which is obtained by sealing a device with the resin composition for sealing electronic components according to claim 5.

9. A varnish, adhesive or paste which comprises the layered zirconium phosphate according to claim 1.

10. The varnish, adhesive or paste according to claim 9, which further comprises an inorganic anion exchanger.

11. A product which comprises the varnish, adhesive or paste according to claim 9.

* * * * *